United States Patent
Takizawa

(10) Patent No.: US 6,339,234 B1
(45) Date of Patent: Jan. 15, 2002

(54) SEMICONDUCTOR INTEGRATED CIRCUIT DEVICE WITH ENHANCED PROTECTION FROM ELECTROSTATIC BREAKDOWN

(75) Inventor: Noboru Takizawa, Yokohama (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/583,539

(22) Filed: Jun. 1, 2000

(30) Foreign Application Priority Data

Jun. 24, 1999 (JP) .......................................... 11-178724

(51) Int. Cl.$^7$ .............................................. H01L 27/10
(52) U.S. Cl. ..................... 257/203; 257/207; 257/208; 257/210
(58) Field of Search ............................. 257/203, 207, 257/208, 210, 211

(56) References Cited

U.S. PATENT DOCUMENTS 5,347,150 A * 9/1994 Sakai et al. .................. 259/203
5,401,989 A * 3/1995 Kikuchi ....................... 257/211
5,952,684 A * 9/1999 Tashiro ........................ 257/207

* cited by examiner

Primary Examiner—Ngân V. Ngô
(74) Attorney, Agent, or Firm—Morgan, Lewis & Bockius LLP

(57) ABSTRACT

In a semiconductor integrated circuit device comprising electrodes, loop wires, an input/output circuit, and an internal circuit arranged in order from a peripheral portion to a central portion of a substrate, and a pair of power wires each having a path from an associated one of the electrodes to the internal circuit through an associated loop wire. The pair of power wires are routed such that a connecting point of the one power wire from the associated loop wire to the internal wire corresponds to a connecting point of the other power wire from the associated loop wire to the internal wire, and the connecting point of the other power wire from the loop wire to the internal circuit corresponds to a connecting point of the one power wire from the associated electrode to the associated loop wire. An input/output circuit is moved closer to the electrodes, as a result of replacement of connecting positions of the paired power wires to the internal circuit, even from a viewpoint of the circuit configuration, to reduce the amount of surge noise leaking to the internal circuit. Consequently, a semiconductor integrated circuit device highly resistant to electrostatic breakdown and compatible with automatic designing is realized.

3 Claims, 6 Drawing Sheets

SEMICONDUCTOR INTEGRATED CIRCUIT DEVICE WITH ENHANCED PROTECTION FROM ELECTROSTATIC BREAKDOWN

This application claims the benefit of Japanese application No. 11-178724, filed Jun. 24, 1999, which is hereby incorporated by reference.

BACKGROUND OF THE INVENTION

The present invention relates generally to a semiconductor integrated circuit device, and more particularly to the technology associated with the structure and layout of a semiconductor integrated circuit, which is created particularly in consideration of the protection from electrostatic breakdown and the compatibility with automatic layout.

In semiconductor integrated circuit devices, the percentage of automatic designing has been increased for a protection circuit in input/output circuits and internal circuits by locating electrodes, loop wires & input/output circuits, and internal circuits from a peripheral region to a central region in order, and by connecting respective power wires, which extend from the electrodes to the internal circuits, to the loop wires on route (see FIGS. 5A and 5B, and Description of Prior Art in JP-A-5-145015). The protection circuit may be formed between a power and a ground lines associated with the input and output circuit (see FIGS. 6A and 6B), or formed through input and output lines (prior art examples shown in JP-A-10-74893, and so on). Also, a protection circuit formed in an elongated region is also known for enhancing the protection ability to the electrostatic breakdown (see JP-A-6-224372).

Among semiconductor integrated circuit devices as mentioned, detailed description will be given on an IC chip 1, the structure of which is illustrated in FIGS. 5A and 5B. FIG. 5A generally illustrates the layout of the IC chip 1, and FIG. 5B is a schematic diagram illustrating a main portion of the IC chip 1 in perspective view. FIGS. 6A and 6B in turn illustrate the structure of a protection circuit in input/output circuits of the IC chip 1, wherein FIG. 6A is a schematic vertical sectional view, and FIG. 6B illustrates an equivalent circuit which is assumed in consideration of a discharge to ground terminal or powering terminal. Further, FIGS. 7A and 7B illustrate equivalent circuits which are assumed in consideration of a discharge to grounded terminals and so on over the entire circuit, wherein FIG. 7A illustrates a circuit diagram in favor of spatial relative positions of components, whereas FIG. 7B illustrates a circuit diagram in favor of discharge paths through the components.

The IC chip 1 is generally formed in the shape of a quadrilateral thin plate by dicing a semiconductor substrate such as a silicon wafer having integrated circuits formed on the main surface thereof. The layout of the integrated circuit is designed in such a manner that a large number of electrodes 2, 3, 4 for external connections such as bonding pads are located in peripheral regions along the four sides. A majority of the electrodes are assigned to I/O pads 2 for signal input/output, and some of the remaining electrodes are assigned to a Vdd pad 3 for power supply and a GND pad 4 for grounding, which are formed in pair, in order to supply operating power to an internal circuit 8 and an I/O circuit 7 from the outside. Inside the electrodes 2, 3, 4, the integrated circuit includes a Vdd line (loop wire) 5 made of aluminum or the like and formed in a loop-like wiring pattern, and a GND line (another loop wire) 6 which makes a round inside the Vdd line 5. Further, the I/O circuit (input/output circuit) 7 is disposed between and underlying these loop wires 5, 6.

In a remaining central portion of the IC chip, the internal circuit 8 is disposed.

In addition, an outer Vdd line 5a extends inwardly from the Vdd pad 3 (electrode for power supply) and is connected to the Vdd line 5 (loop wire associated therewith); an intermediate Vdd line 5b extends inwardly beyond the GND line 6; and an inner Vdd line 5c further extends or branches from the intermediate Vdd line 5b, and is eventually connected to the internal circuit 8. These Vdd lines 5a–5c complete one of paired power wires. The other of the paired power wires is completed by an outer GND line 6a which extends inwardly from the GND pad 5 (electrode to the ground) beyond the Vdd line 5 and is connected to the GND line 6 (loop wire associated therewith); an intermediate GND line 6b which extends further inwardly from the GND line 6; and an inner GND line 6c which further extends or branches from the intermediate GND line 6b, and is eventually connected to the internal circuit 8.

Among these power wires, the outer Vdd line 5a, the intermediate Vdd line 5b, the outer GND line 6a, and the intermediate GND line 6b generally present substantially linear simple patterns. Also, these power wires and loop wires 5, 6 are thicker than branching lines such as the inner Vdd line 5c and the inner GND line 6c. It should be noted that while FIG. 5B illustrates the power lines 5a, 5b, 6a, 6b as if they were bonding wires, this is because the illustration emphasizes the three-dimensional appearance to clearly show how connections are made. Actually, they are often formed of multi-layer wiring patterns.

In the region of the I/O circuit 7 (see FIG. 6A), a number of wells are generally formed for element separation, and transistors and so on may be fabricated therein for driving a variety of input/output signals. For receiving the driving power for the transistors and for protecting the components from an unwanted reverse bias and so on, connections are made to positive and negative supply voltage lines, a ground line, and so on. At the connected locations, diodes 7a are explicitly or parasitically provided by PN junctions or the like. The diodes 7a may be connected to the overlying Vdd line 5 or GND line 6. Then (see FIG. 6B), the diodes 7a or equivalent back-flow blocking means, capacitors 7b parasitically formed thereby, and so on cause surge noise introduced into signal input/output lines, the GND line 6 and so on to promptly escape to the Vdd line 5 or the like.

Further, the internal circuit 8 is formed with a number of logical circuits, digital or analog signal processing circuits, and so on, corresponding to a variety of applications, wherein the operating power required thereby is supplied through thin wires branched off from the inner Vdd line 5c and the inner GND line 6c.

A majority of individual circuits within the IC chip 1 is automatically laid out using a design aid tool such as a computer. Specifically, when data such as the chip size, the number of pads and so on are given as design parameters, the positioning of the I/O pads 2 and so on, the routing of the Vdd line 5 and the GND line 6 are automatically determined. Likewise, for the power lines 5a–5c and 6a–6c, once data on the positioning of the Vdd pad 3 and the GND pad 4 are given as design parameters, the wiring from the pads 3, 4 to the internal circuit 8 is automatically determined from the design parameters. Further, the other circuits 7, 8 and branching and routing of power wires connected thereto are also automatically laid out based on other design parameters corresponding to particular applications.

SUMMARY OF THE INVENTION

With a semiconductor integrated circuit device having a layout as described above (see FIGS. 5A and 5B), when consideration is made to an electrostatic discharge to a ground terminal connected to the ground electrode 4 and a power terminal connected to the power electrode 3, the input/output circuit 7 is located closer to the power supply electrodes 3, 4 than the internal circuit 8 from a spatial point of view (see FIG. 7A), whereas the internal circuit 8 is located closer to the power supply electrodes 3, 4 than the input/output circuit 7 from a viewpoint of electric or electronic circuit (see FIG. 7B), when viewed in the equivalent circuits. For this reason, parasitic resistances 5d, 6d formed of resistance components, inductance and so on distributed over the loop wires 5, 6 act on the input/output circuit 7 larger than on the internal circuit 8, causing surge noise generated by a discharge or the like and introduced into the electrode 4 and so on to leak more or less into the internal circuit 8. In many cases, however, such leakage has so far been accommodated by the layout described above (see FIGS. 5A and 5B).

Unfortunately, since increasingly advanced miniaturization of the internal circuit results in more and more reduced resistance of the internal circuit, the internal circuit would not be sufficiently protected from an electrostatic discharge or the like to the ground terminal and powering terminal, unless some appropriate actions are taken. This would be a significant inconvenience.

To solve this problem, it is contemplated to utilize the technique described in JP-A-6-224372 which, however, is not compatible with a layout based on loop wires since JP-A-6-224372 relies on the existence of a starting end on a power wire. In addition, since this technique requires setting of the length of an area in which a protection circuit is formed, the number of required parameters is increased, thus making the technique inappropriate to automatic designing.

It will therefore be appreciated that there exists a technical challenge in how to enhance the protection capability for the internal circuit against the electrostatic breakdown without limiting the convenience of the automatic layout.

The present invention has been made to solve the problem mentioned above, and its object is to provide a semiconductor integrated circuit device which is highly resistant to the electrostatic breakdown and also compatible with automatic designing.

A semiconductor integrated circuit device in a first aspect of the present invention made to solve the problem mentioned above comprises a number of electrodes formed of bonding pads, bumps or the like, a plurality of loop wires such as power wires, ground wires and so on, a number of input/output circuits, and an internal circuit having all or part of circuit elements smaller than those in the input/output circuits. These components are arranged in order from a peripheral region to a central region of a substrate. Within the power wires originating from a pair or a plurality of the electrodes assigned for power supply and routed to the internal circuit directly or indirectly through associated loop wires, paired power wires such as those for powering or grounding, or positive and negative power wires each have a path from an associated one of the electrodes to the internal circuit through an associated loop wire, wherein one of power wires within the pair is connected to the internal circuit at a location closer to the electrode associated with the other power wire than to the electrode associated with the one power wire.

According to the semiconductor integrated circuit in the first aspect as described above, the power wire from the power supply electrode to the internal circuit is not only connected halfway to the loop wire as previously mentioned, but also passes the entirety or a portion of the loop wire from the connecting point therewith, and is separated from the loop wire at a location close to the connecting point of the other power wire with the associated loop wire near the electrode associated with the other power wire in the pair.

With the foregoing structure, the connecting positions of the paired power wires with the internal circuit are replaced with each other, making use of the loop wires. As the result of the replacement, an input/output circuit existing between the replaced connecting positions is moved to a location between the internal circuit and the power supply electrode on the power wire or power supply path, even from a viewpoint of the circuit.

Thus, even if surge noise or the like is introduced into the power supply electrode, a protection circuit in the replaced input/output circuit acts to let the noise to escape therethrough, thereby reducing the amount of the surge noise or the like which may reach the internal circuit. And, such a change of layout is achieved without no new design parameter, so the automatic layout is useful.

It is therefore possible, according to the first aspect of the present invention, to realize a semiconductor integrated circuit device which is highly resistant to electrostatic breakdown and also compatible with automatic designing.

A semiconductor integrated circuit device in a second aspect of the present invention made to solve the problem mentioned above comprises a number of electrodes formed of bonding pads, bumps or the like, a plurality of loop wires including power wires, ground wires and so on, a number of input/output circuits, and an internal circuit having all or part of circuit elements smaller than those in the input/output circuit. These components are arranged in order from a peripheral region to a central region of a substrate. Within the power wires originating from a pair or a plurality of the electrodes assigned for power supply and routed to the internal circuit directly or indirectly through associated loop wires, paired power wires such as those for powering or grounding, or positive and negative power wires each have a path from an associated one of the electrodes to the internal circuit through an associated loop wire, wherein the pair of power wires are routed such that a connecting point of the one power wire from the associated loop wire to the internal wire corresponds to a connecting point of the other power wire from the associated loop wire to the internal circuit, and the connecting point of the other power wire from the loop wire to the internal circuit corresponds to a connecting point of the one power wire from the associated electrode to the associated loop wire.

According to the semiconductor integrated circuit device in the second aspect as described above, the power wire from the power supply electrode to the internal circuit passes the entirety or a portion of the loop wire from the connecting point therewith, and is separated from the loop wire at a location close to the connecting point of the other power wire with the associated loop wire near the electrode associated with the other power wire in the pair, so that the connecting positions of the paired power wires with the internal circuit are replaced with each other, making use of the loop wires. Furthermore, given parameters required to determine the connecting positions of the power supply electrodes to the loop wires, the connecting points of the power supply electrodes to the circuit wires are automatically determined because of their correspondence to the parameters.

Thus, in addition of the replacement of connecting positions of the paired power wires with respect to the internal circuit making use of the loop wires, the correspondence relationship becomes apparent when the replacement is performed. In addition, since the respective connecting positions remain substantially unchanged except for the replacement, differences in parameters and so on required for the automatic layout are eliminated by automatical processing such as copying, swapping or the like of preset parameter values, thus making it easier to change an existing design tool and so on.

It is therefore possible, according to the second aspect of the present invention, to readily realize a semiconductor integrated circuit device which is highly resistant to electrostatic breakdown and also compatible with automatic designing.

A semiconductor integrated circuit device in a third aspect of the present invention made to solve the problem mentioned above is a modification to the semiconductor integrated circuit device in the second aspect, wherein the power wires formed in pair, or at least portions of the power wires which run across the inner and outer loop wires, are offset from each other in regions corresponding to the connecting positions, i.e., the connecting position from the outer loop wire to the internal circuit and the connecting position from the associated electrode to the inner circuit wire, such that the power wires can extend in parallel.

According to the semiconductor integrated circuit device in the third aspect as described above, the paired power wires are offset so as to run in parallel in such a region in which the paired power wires would otherwise overlap with each other, thus making it possible to eliminate additional wiring layers and an insulating layer sandwiched therebetween for mutual insulation, a increase in semiconductor manufacturing steps required for such additional wiring layers, and a consequently increased cost. Since the amount of offset can be uniquely predefined on the basis of a required distance for insulating the pair of parallelly running power wires, the offset power wires would never damage the corresponding relationship of the connecting positions or impede the automatic layout processing.

In this way, the connecting positions of the paired power wires with the internal circuit are replaced with each other, making use of the loop wires, and since the replacement does not cause the power wires to overlap, additional wiring layers are not required.

It is therefore possible, according to the third aspect of the present invention, to readily and economically realize a semiconductor integrated circuit device which is highly resistant to electrostatic breakdown and also compatible with the automatic designing.

DETAILED DESCRIPTION OF THE PREFERRED EMBODIMENTS

The present invention will hereinafter be described in a rather specific manner with reference to the following first to third embodiments.

Figure 2A:
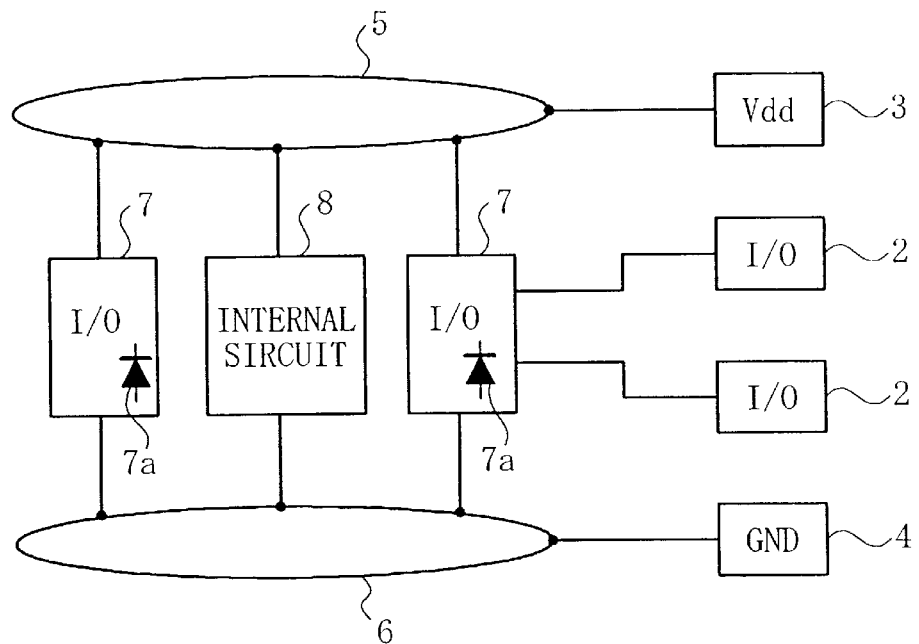
FIG. 2A illustrates an equivalent circuit of components in FIG. 1, which is assumed in consideration of a discharge to a ground terminal and so on, illustrated in favor of spatial relative positions of the components.
Figure 2B:
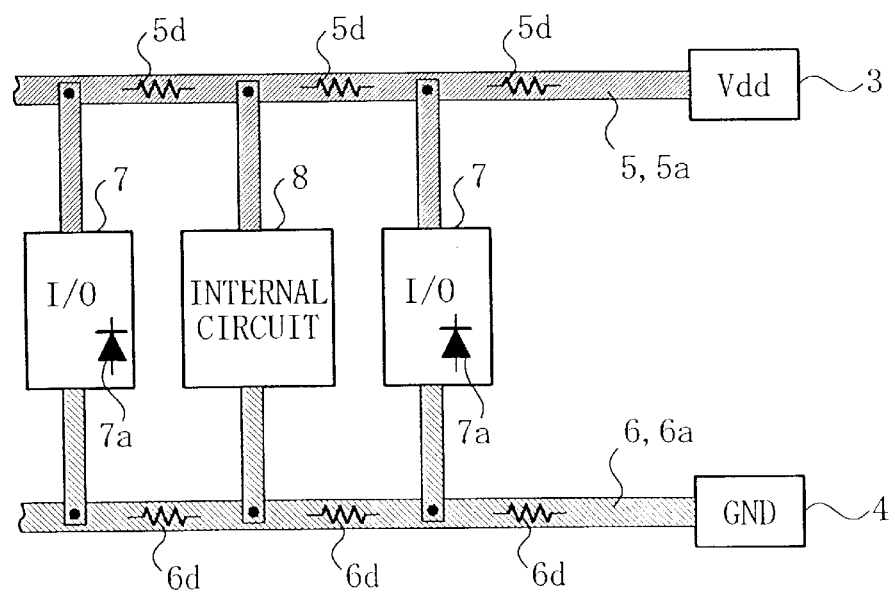
FIG. 2B illustrates an equivalent circuit of the components in FIG. 1, similar to FIG. 2A, which is assumed in consideration of a discharge to a ground terminal and so on, illustrated in favor of discharge paths.
Figure 3:
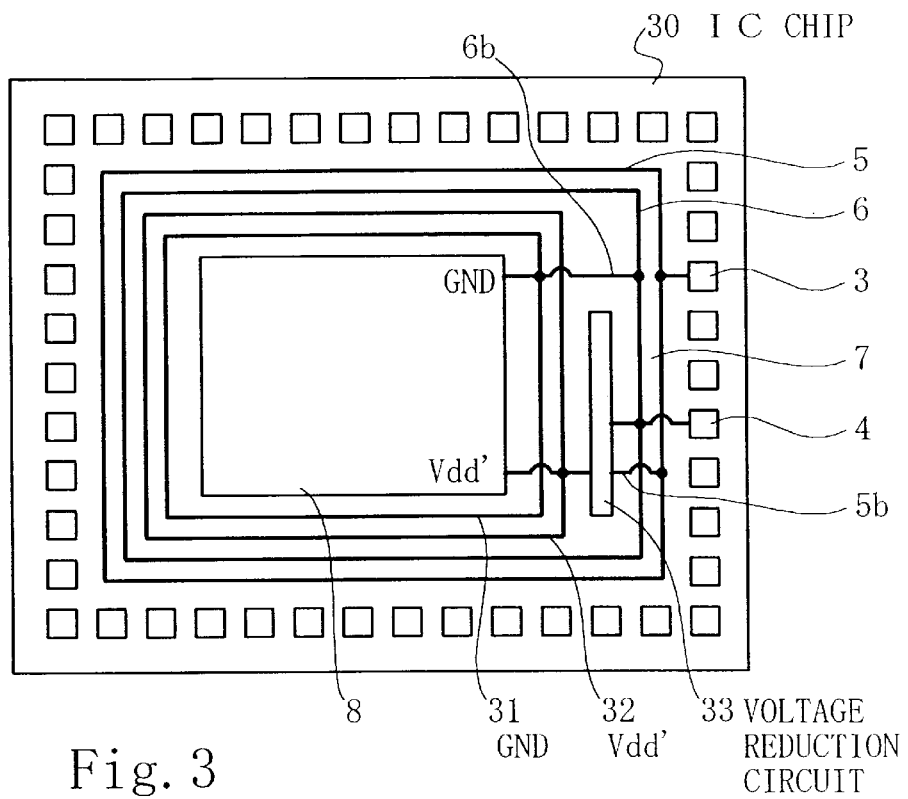
FIG. 3 is a top plan view generally illustrating the layout of a second embodiment of the semiconductor integrated circuit device according to the present invention.
Figure 4:
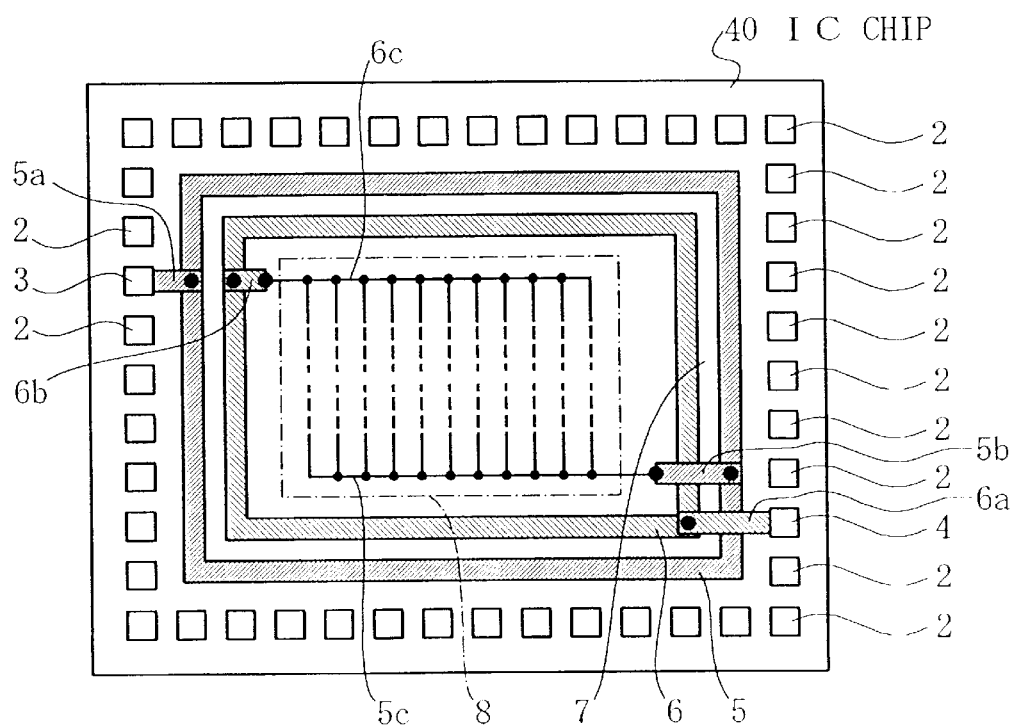
FIG. 4 is a top plan view generally illustrating the layout of a third embodiment of the semiconductor integrated circuit device according to the present invention.
Figure 5A:
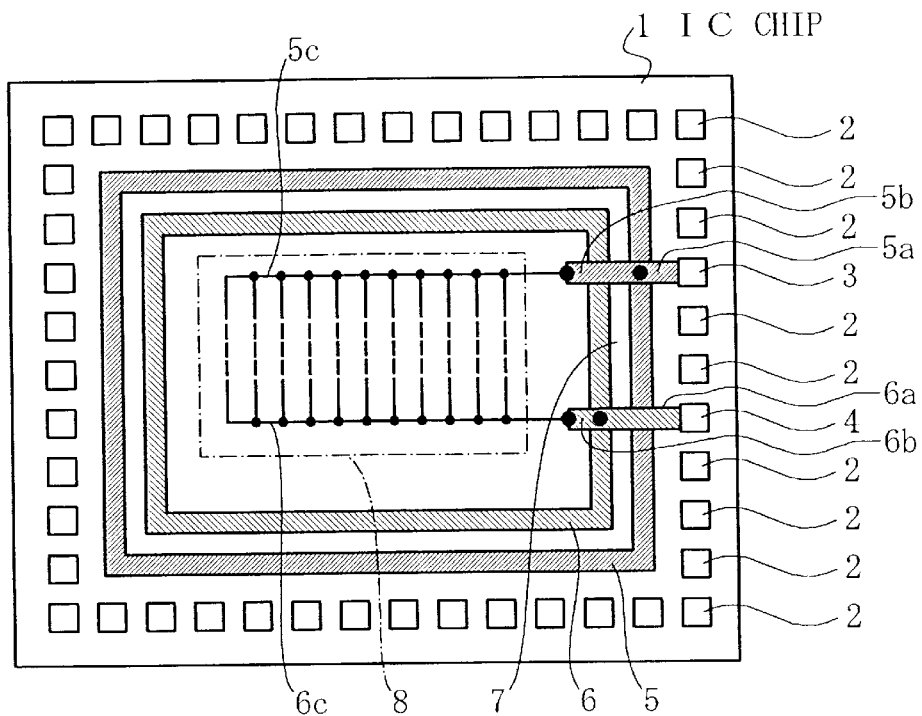
FIG. 5A is a top plan view generally illustrating the layout of a prior art semiconductor integrated circuit device.
Figure 5B:
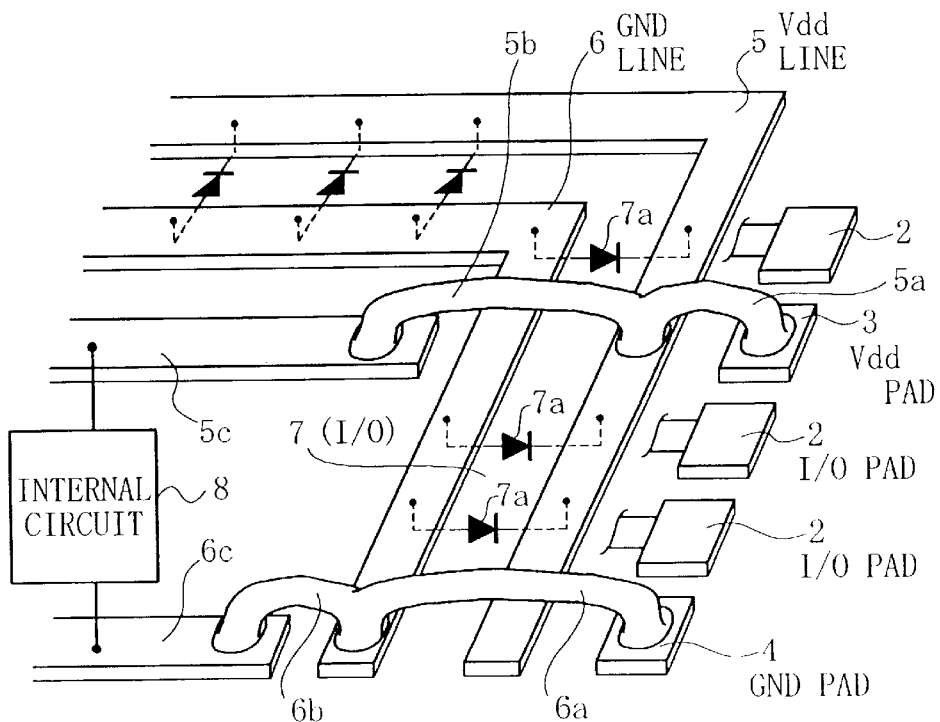
FIG. 5B is a schematic diagram illustrating a main portion of FIG. 5A in perspective view.
Figure 6A:
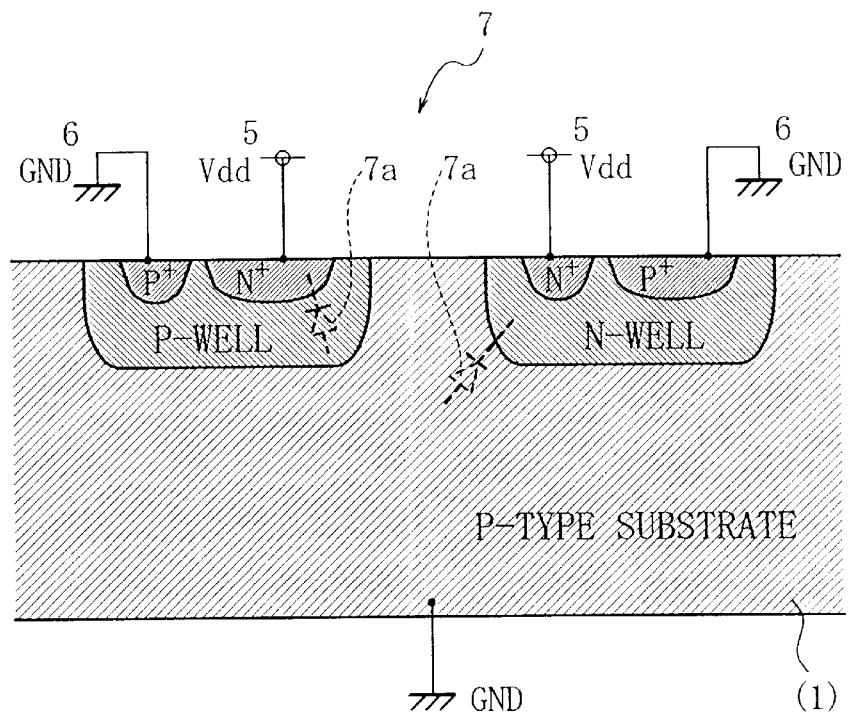
FIG. 6A is a schematic vertical sectional view of an IC for showing the structure of a protection circuit in an input/output circuit of the prior art semiconductor integrated circuit device.
Figure 6B:
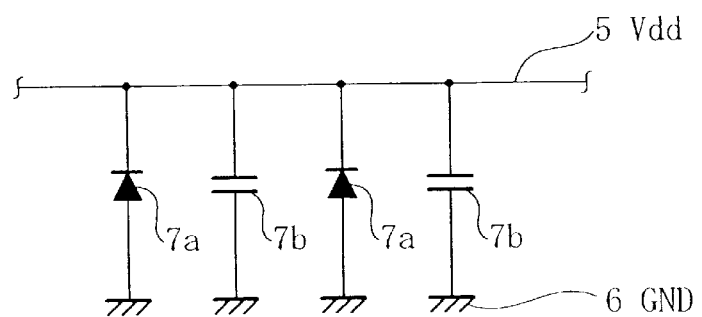
FIG. 6B illustrates an equivalent circuit of components in FIG. 6A, which is assumed in consideration of a discharge to a ground terminal.

A first embodiment illustrated in FIGS. 1 and 2, a second embodiment illustrated in FIG. 3, and a third embodiment illustrated in FIG. 4 all embody the aforementioned first to third solving means. It should be noted that components similar to those described above are designated the same reference numerals, so that repetitive description thereon is omitted. Thus, the following description will focus on differences between the embodiments of the present invention and the prior art example which has been shown in FIGS. 5 and 6 and discussed above.

Figure 1A:
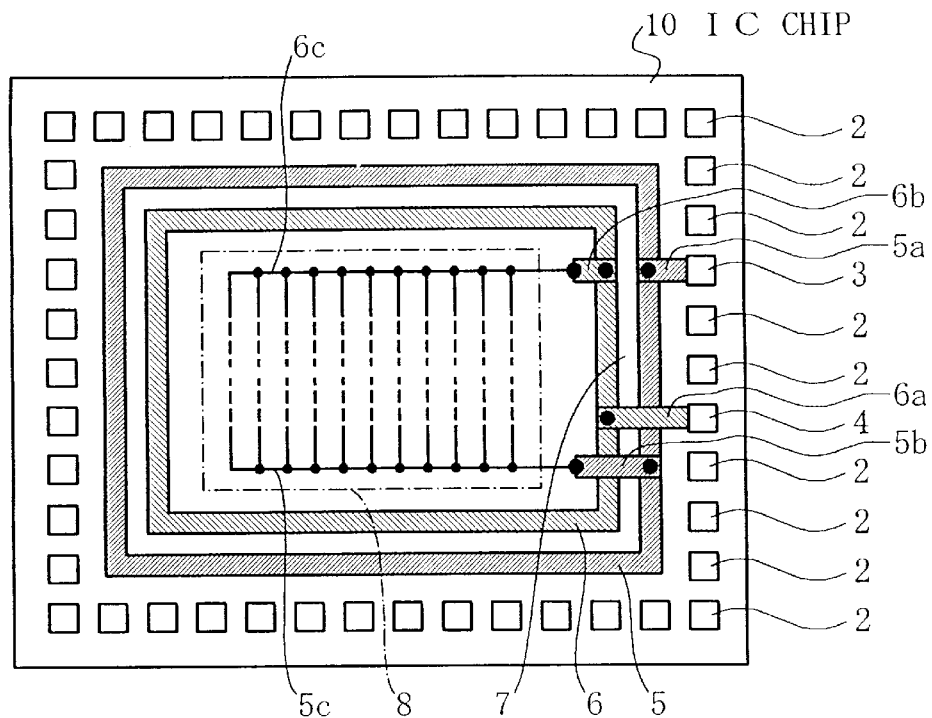
FIG. 1A is a top plan view generally illustrating the layout of a first embodiment of a semiconductor integrated circuit device according to the present invention.
Figure 1B:
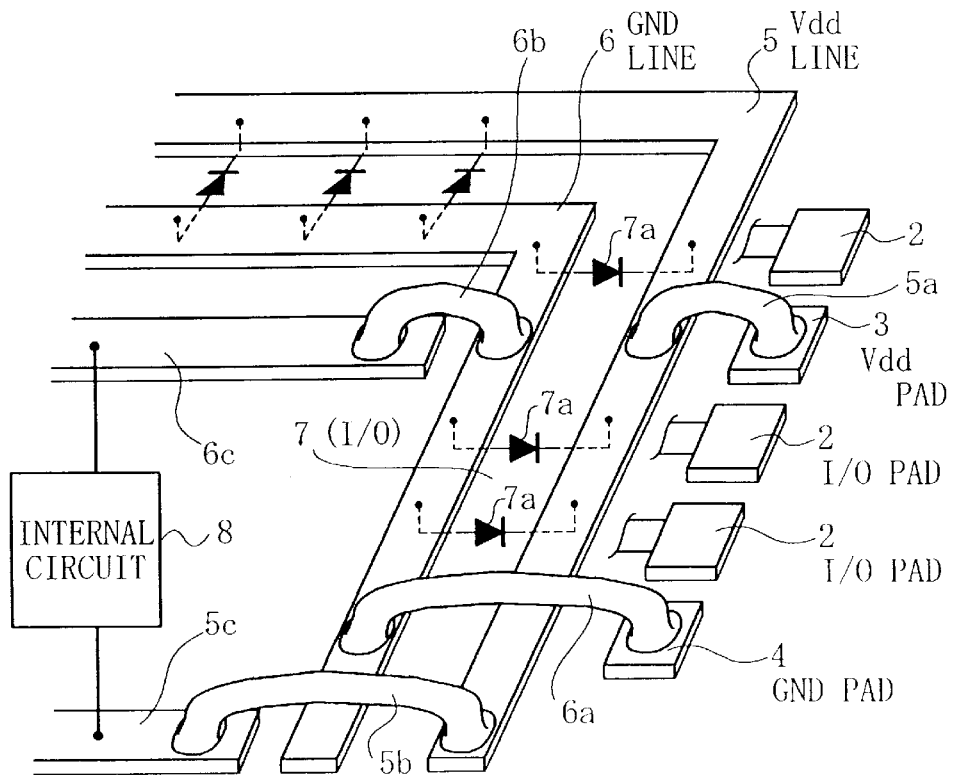
FIG. 1B is a schematic diagram illustrating a main portion of FIG. 1A in perspective view.

To begin with, the first embodiment of a semiconductor integrated circuit device according to the present invention will be described in terms of its specific structure, layout approach, and soon, with reference to related drawings. FIGS. 1A and 1B illustrate the structure of the first embodiment of the semiconductor integrated circuit device, wherein FIG. 1A generally illustrates the layout, and FIG. 1B is a schematic diagram illustrating a main portion of the layout in perspective view. It can be seen that FIGS. 1A and 1B correspond to the previously described FIGS. 5A and 5B, respectively.

The illustrated IC chip 10 (semiconductor integrated circuit device) differs from the aforementioned IC chip 1 in that the intermediate GND line 6b is separated from the outer GND line 6a at the location of the GND line 6, and is moved to a location at which the intermediate Vdd line 5b previously existed; and that the intermediate Vdd line 5b is separated from the outer Vdd line 5a at the location of the Vdd line 5, and is moved next to a location at which the intermediate GND line 6b previously existed. In addition, the inner Vdd line 5c and the inner GND line 6c are also moved together with the intermediate Vdd line 5b and the intermediate GND line 6b, to which they are connected, onto extensions of these lines.

The outer Vdd line 5a ends at the outer Vdd line 5 to which it is connected, and does not reach the GND line 6 and therefore avoids interfering with the intermediate GND line 6b. The intermediate GND line 6b is located on the extension of the outer Vdd line 5a and connected to the GND line 6, whereas the outer GND line 6a extends to the inner GND line 6 and is connected thereto. The intermediate Vdd line 5b passes over the GND line 6 and connected to the outer Vdd line 5, so that the intermediate Vdd line 5b interferes with the outer GND line 6a. Thus, the intermediate Vdd line 5b is shifted in a direction away from the outer Vdd line 5a, if possible, or otherwise in a direction closer thereto by a predetermined distance or more which ensures isolation between the intermediate Vdd line 5b and the outer GND line 6a.

For achieving automatic layout for the circuit configuration as described above, a design aid tool for the IC chip 10 performs, in addition to the existing general processing, extra processing such as replacement of some of positioning data on the intermediate Vdd line 5b and the inner Vdd line 5c with associated data on the outer GND line 6a, replacement of some of positioning data on the intermediate GND line 6b and the inner GND line 6c with associated data on the outer Vdd line 5a, and so on. Also, since certain replacements may cause interference between the outer Vdd line 5a and the intermediate GND line 6b, and/or interference between the outer GND line 6a and the intermediate Vdd line 5b, the design aid tool also checks for such interference as well as shifts the intermediate Vdd line 5b and the intermediate GND line 6b by a predetermined distance if required to avoid the interference. The design aid tool is thus equipped with modified programs.

Once the design aid tool as described is provided with the same design parameters as those so far provided, the layout of the IC chip 10 is automatically made rather than the aforementioned IC chip 1. In this event, within a plurality of electrodes 3, 4 assigned for power supply, although the design aid tool should be provided with data on assignment of the Vdd pad 3 and the GND pad 4 as before for the pairs of power lines 5a–5c, 6a–6c reaching the internal circuit 8 through the loop wires 5, 6, other new data is not needed.

In the IC chip 10 designed by the automatic layout processing as described above, within the paired power lines 5a–5c, 6a–6c, a connecting position from the loop wire 5 to the internal circuit 8 in the first power lines 5a–5c of the pair, i.e., a connecting point of the intermediate Vdd line 5b corresponds to a connecting position from the electrode 4 to the loop wire 6 in the second power lines 6a–6c of the pair, i.e., a connecting point of the outer GND line 6a. Further, a connecting position from the loop wire 6 to the internal circuit 8 in the second power lines 6a–6c, i.e., a connecting point of the intermediate GND line 6b corresponds to a connecting position from the electrode 3 to the loop wire 5 in the first power lines 5a–5c, i.e., a connecting point of the outer Vdd line 5a.

Furthermore, within the corresponding regions related to the connecting positions, a corresponding region of the outer GND line 6a to the intermediate Vdd line 5b is such that the outer GND line 6a and the intermediate Vdd line 5b extend over the inner and outer loop wires 5, 6, respectively, wherein the intermediate Vdd line 5b slightly offsets in a lateral direction, and both the lines 6a, 5b run in parallel at the same height. In this way, the IC chip 10 only requires the same number of wiring layers as the conventional IC chip 1 not only for the loop wires 5, 6 but also for the power lines 5a–5c, 6a–6c. Then, apart from the replacement of a reticle corresponding to a modified pattern for the power lines 5a–5c, 6a–6c, and so on, the IC chip 10 is completed through the same semiconductor processes as the IC 1.

Figure 7A:
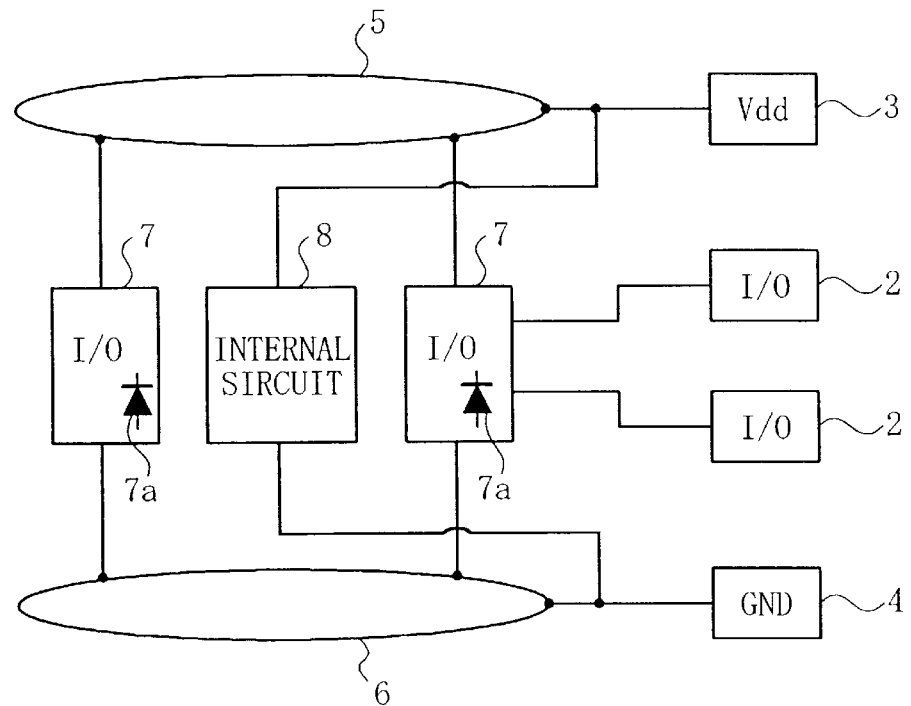
FIG. 7A illustrates an equivalent circuit devised to solve the problem, which is assumed in consideration of a discharge to a ground terminal and so on, illustrated in favor of spatial relative positions of the components.
Figure 7B:
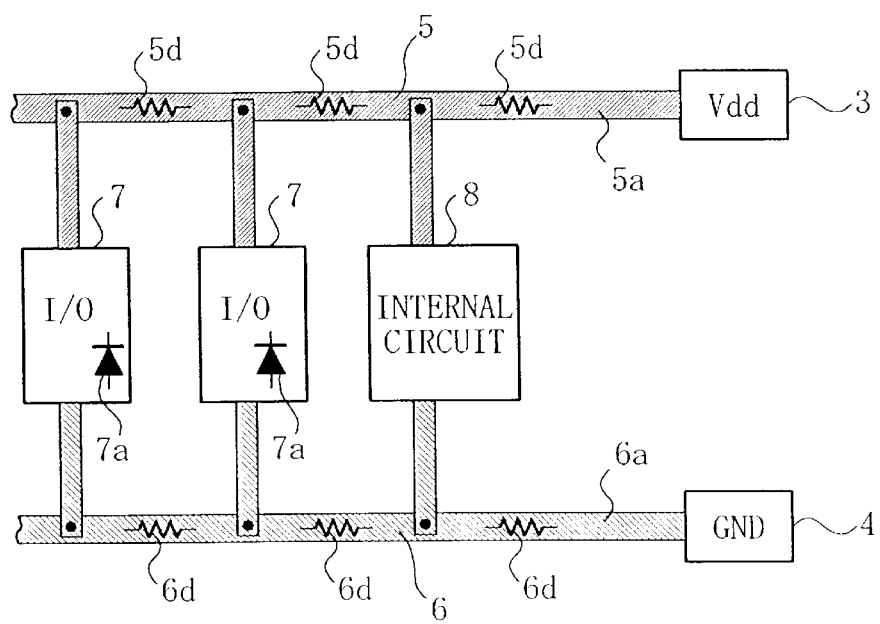
FIG. 7B illustrates an equivalent circuit devised to solve the problem, similar to FIG. 7A, which is assumed in consideration of a discharge to a ground terminal and so on, illustrated in favor of discharge paths.

Next, the semiconductor integrated circuit device according to the first embodiment will be further described in terms of the operation, when it is in use, with reference to associated drawings. FIGS. 2A and 2B illustrate equivalent circuits of components in FIG. 1, which is assumed in consideration of a discharge to the ground terminal and the power terminal, wherein FIG. 2A is illustrated in favor of spatial relative positions of the components, while FIG. 2B is illustrated in favor of discharge paths through the components. It can be seen that FIGS. 2A and 2B correspond to FIGS. 7A and 7B, respectively.

In the IC chip 10, a portion of the loop wire 5 and the loop wire 6 positioned between the outer Vdd line 5a and the outer GND line 6a is included in power supply paths from the Vdd pad 3 and the GND pad 4 to the internal circuit 8. Specifically, the path from the Vdd pad 3, reaches the intermediate Vdd line 5b through the outer Vdd line 5a and subsequently the loop wire 5 intervening therebetween. The path from the GND pad 4 in turn reaches the intermediate GND line 6b through he outer GND line 6a and subsequently the loop wire 6 intervening therebetween.

In the equivalent circuit which is assumed in consideration of an electrostatic discharge to the Vdd pad 3 and the GND pad4, the I/O circuit 7 is located closer to the pads 3, 4 than the internal circuit 8 from a spatial point of view (see FIG. 2A). Moreover, the I/O circuit 7 between the outer Vdd line 5a and the outer GND line 6a is located closer to the pads 3, 4 than the internal circuit 8 as well from a viewpoint of electric or electronic circuit (see FIG. 2B). For this reason, parasitic resistances 5d, 6d formed of resistance components, inductance and so on distributed over the loop wires 5, 6 act on the internal circuit 8 larger than before, and particularly act on the internal circuit 8 larger than on the input/output circuit 7 existing between the outer Vdd line 5a and the outer GND line 6a, so that surge noise due to a discharge or the like is allowed to promptly escape through the diode 7a and the capacitor 7b and parasitic capacitance between the loop wires 5, 6 running in parallel, thus reducing the surge noise leaking to the internal circuit 8.

Next, a second embodiment of the semiconductor integrated circuit device (IC chip 30) will be described with reference to FIG. 3 which generally illustrates the layout of the IC chip 30. The illustrated IC chip 30 differs from the IC chip 10 of the first embodiment in that a pair of additional loop wires consisting of a GND line 31 and a Vdd' line 32 is disposed between the GND line or loop wire 6 and the internal circuit 8, and that a voltage reduction circuit 33 is additionally disposed between the GND line 6 and the Vdd' line 32.

The GND line 31 and the Vdd' line 32 are formed of a wiring material identical to or slightly thinner than that of the GND line or inner loop wire 6 and the Vdd line or outer loop wire 5.

The voltage reduction circuit 33 may comprise an appropriate DC—DC converter or the like to produce, for example, a voltage (Vdd') such as two volts suitable for driving the internal circuit 8 from a voltage (Vdd) such as five volts or three volts directly used for driving the I/O circuit 7.

Then, corresponding to the additional components, the intermediate GND line 6b is connected to the GND line 31 on route. The intermediate Vdd line 5b in turn has the voltage reduction circuit 33 interposed halfway and is subsequently connected to the Vdd' line 32 as well.

The positional replacement of the intermediate Vdd line 5b with the intermediate GND line 6b is maintained in the second embodiment.

In the second embodiment, an additional pair of loop wires are disposed, and the voltage reduction circuit 33 is interposed in the middle of a path from the loop wire 5 to the internal circuit 8, so that the power lines 5a, 5b, 5c are indirectly integrated. However, an equivalent circuit which is assumed in consideration of an electrostatic discharge to the Vdd pad 3 and the GND pad 4 is similar to that of the first embodiment (see FIGS. 2A and 2B), so that the second embodiment can also reduce the amount of leaked surge noise to the internal circuit 8 due to a discharge or the like in a manner similar to the foregoing.

Next, a third embodiment of the semiconductor integrated circuit device (IC chip 40) will be described with reference to FIG. 4 which generally illustrates the layout of the IC chip 40. The IC chip 40 differs from the IC chip 10 of the first embodiment in that the Vdd pad 3 is moved from the right side of chip to the opposing left side. Correspondingly, the outer Vdd line 5a, intermediate GND line 6b and inner GND line 6c are automatically moved in a left side region of the chip as well.

In this structure, as the Vdd pad 3 and the GND pad 4 are assigned such that both are located at or near centrally symmetrical points with respect to the center of the IC chip 40, the layout is automatically produced for the IC chip 40.

Then, in regard to an equivalent circuit which is assumed in consideration of an electrostatic discharge to the Vdd pad 3 and the GND pad 4, not only a portion of the I/O circuits 7 but also substantially all of the I/O circuits 7 corresponding to the entire round of the loop wires 5, 6 are located closer to the Vdd pad 3 and the GND pad 4 than the internal circuit 8 from a viewpoint of electric or electronic circuit.

As a result, the structure according to the third embodiment can further reduce the amount of surge noise or the like leaking to the internal circuit 8.

It should be noted that while the respective embodiments described above have been directed to a situation where an ideal automatic layout is performed for the design of the respective IC chips, the present invention is not limited to such particular situation but may be applied to semi-automatic or manual layout. Even if connecting positions of the power lines 5a–5c, 6a–6c are changed or replaced, the connecting positions can be readily found immediately from data that is applied to the connecting positions without any change or replacement, or with a small amount of calculations, if any, so that the present invention is beneficial to any design schemes.

Also, the material for the IC chips 10, 30, 40 is not limited to silicon, but other appropriate semiconductor materials may also be used to manufacture the IC chips. Further, they may be in the form of bare chip or encapsulated in appropriate plastic packages, ceramic package or the like.

The electrodes 2, 3, 4 are not limited to bonding pads, but may be bumps, TAB connections, or the like. The GND pad 4 is not limited to the ground, but may be applied with a positive or negative supply voltage.

The lines 5, 5a, 5b, 5c, 6, 6a, 6b, 6c are not limited to aluminum wires but maybe made of any appropriate metal such as copper, or other good electrically conductive materials.

In essence, a semiconductor integrated circuit device in a first aspect of the present invention utilizes the loop wires to replace the connecting positions of the paired power wires, so that the input/output circuit, which has existed between the replaced connecting positions, is moved to a location between the internal circuit and the Vdd & GND electrodes to reduce the amount of leaked surge noise or the like to the internal circuit and to avoid an increase in parameters required for the automatic layout, thereby making it possible to realize a semiconductor device which is highly resistance to electrostatic breakdown and compatible with the automatic design.

Also, a semiconductor integrated circuit device in a second aspect of the present invention utilizes the loop wires to replace the connecting positions of the paired power wires and clearly define the correspondence relationship between the connecting positions, so that respective connecting positions except for replaced ones, and accordingly the design tool can be readily modified, thereby making it possible to readily realize a semiconductor device which is highly resistance to electrostatic breakdown and compatible with the automatic design.

Further, a semiconductor integrated circuit device in a third aspect of the present invention utilizes the loop wires to replace the connecting positions of the paired power wires in such a manner that the replaced connecting positions do not cause the power wires to overlap with each other, so that no additional wiring layers are required, thereby making it possible to readily and economically realize a semiconductor device which is highly resistance to electrostatic breakdown and compatible with automatic design.

What is claimed is:

1. A semiconductor integrated circuit device comprising:

a substrate;

electrodes, first loop wire, an input/output circuit, and an internal circuit arranged in order from a peripheral region to a central region of said substrate; and a pair of power wires each having a path from an associated one of said electrodes to said internal circuit through an associated loop wire, wherein one of the power wires within said pair is connected to said internal circuit at a location closer to the electrode associated with the other power wire than the electrode associated with the one power wire.

2. A semiconductor integrated circuit device comprising:

a substrate;

electrodes, first loop wire, an input/output circuit, and an internal circuit arranged in order from a peripheral portion to a central portion of said substrate; and a pair of power wires each having a path from an associated one of said electrodes to said internal circuit through an associated loop wire, wherein said pair of power wires are routed such that a connecting point of said one power wire from the associated loop wire to said internal wire corresponds to a connecting point of the other power wire from the associated loop wire to said internal wire, and the connecting point of said other power wire from said loop wire to said internal circuit corresponds to a connecting point of said one power wire from the associated electrode to the associated loop wire.

3. A semiconductor integrated circuit device according to claim 2, wherein said power wires formed in pair are offset from each other in regions corresponding to the connecting positions such that said power wires extend in parallel.

* * * * *